United States Patent
Song et al.

(10) Patent No.: US 11,881,857 B2
(45) Date of Patent: Jan. 23, 2024

(54) GATE DRIVER WITH TEMPERATURE MONITORING FEATURES

(71) Applicant: SEMICONDUCTOR COMPONENTS INDUSTRIES, LLC, Phoenix, AZ (US)

(72) Inventors: Kinam Song, Gilbert, AZ (US); Ines Armina Hurez, Bucharest (RO); Vlad Anghel, Bucharest (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/854,663

(22) Filed: Jun. 30, 2022

(65) Prior Publication Data

US 2023/0009382 A1 Jan. 12, 2023

Related U.S. Application Data

(60) Provisional application No. 63/219,876, filed on Jul. 9, 2021.

(51) Int. Cl.
*H03K 3/00* (2006.01)
*H03K 3/011* (2006.01)

(52) U.S. Cl.
CPC .................. *H03K 3/011* (2013.01)

(58) Field of Classification Search
CPC .... H03K 3/011; H03K 17/082; H03K 17/163; H03K 17/18; H03K 17/08122
USPC ........................................ 327/109
See application file for complete search history.

(56) References Cited

U.S. PATENT DOCUMENTS

| | | | |
|---|---|---|---|
| 9,608,623 B1 * | 3/2017 | Kandah | G01R 19/0084 |
| 9,673,809 B1 * | 6/2017 | Kandah | H02P 27/08 |
| 9,768,763 B2 * | 9/2017 | Terasawa | H03K 17/0828 |
| 10,374,593 B2 * | 8/2019 | Taoka | H03K 3/011 |
| 10,432,080 B2 * | 10/2019 | Terashima | H02M 1/32 |
| 10,644,581 B2 * | 5/2020 | El Markhi | H02M 3/1563 |
| 11,171,640 B2 * | 11/2021 | Li | H03K 17/14 |
| 11,641,197 B2 * | 5/2023 | Onódy | H03K 17/18 |
| | | | 327/378 |
| 2002/0039269 A1 * | 4/2002 | Kumagai | H03K 17/18 |
| | | | 361/93.1 |

(Continued)

FOREIGN PATENT DOCUMENTS

| | | |
|---|---|---|
| EP | 2996232 A1 | 3/2016 |
| EP | 3223416 A1 | 9/2017 |

OTHER PUBLICATIONS

European Patent Office, "European Search Report," Applicaiton No. 22183735.4-1211, dated Nov. 16, 2022.

(Continued)

*Primary Examiner* — Ryan Jager
(74) *Attorney, Agent, or Firm* — Brake Hughes Bellermann LLP

(57) ABSTRACT

A galvanically isolated gate driver for a power transistor is disclosed. The gate driver provides various temperature protection features that are enabled by (i) diagnostic circuitry to generate fault signals and monitoring signals, (ii) signal processing to enable communication over a shared communication channel across an isolation barrier, (iii) signal processing to reduce operating current needed for real-time thermal monitoring, and (iv) a disable circuit for unused temperature sensing pins.

21 Claims, 9 Drawing Sheets

(56) References Cited

U.S. PATENT DOCUMENTS

| | | | |
|---|---|---|---|
| 2004/0228057 A1* | 11/2004 | Mayama | H02H 3/04 |
| | | | 361/100 |
| 2009/0052214 A1* | 2/2009 | Edo | H01F 27/323 |
| | | | 363/123 |
| 2009/0167414 A1 | 7/2009 | Jansen | |
| 2010/0014195 A1* | 1/2010 | Takahashi | H03K 17/687 |
| | | | 361/18 |
| 2012/0146782 A1* | 6/2012 | Komatsu | H03K 17/18 |
| | | | 340/653 |
| 2012/0219033 A1 | 8/2012 | Tanimura et al. | |
| 2014/0009983 A1* | 1/2014 | Nakamori | H02M 1/084 |
| | | | 363/50 |
| 2017/0077919 A1* | 3/2017 | Nakamori | H03K 17/0828 |
| 2020/0350903 A1 | 11/2020 | Gu et al. | |
| 2022/0065924 A1 | 3/2022 | Barrenscheen et al. | |
| 2023/0009382 A1* | 1/2023 | Song | H03K 17/082 |

OTHER PUBLICATIONS

Analog Devices, Inc., "High Voltage, Isolated IGBT Gate Drive with Isolated Flyback Controller," ADuM4138 Data Sheet, 2018-2019.

NXP Semiconductors, "MC33GD3100 Advanced IGBT/SiC Gate Drive," Product short data sheet, rev. 9.0, Mar. 5, 2020.

* cited by examiner

GATE DRIVER WITH TEMPERATURE MONITORING FEATURES

CROSS-REFERENCE TO RELATED APPLICATION

This application claims the benefit of U.S. Provisional Application No. 63/219,876, filed on Jul. 9, 2021, which is hereby incorporated by reference in its entirety.

FIELD OF THE DISCLOSURE

The present disclosure relates to power switching systems and more specifically to an isolated gate driver having circuitry for monitoring and communicating temperatures.

BACKGROUND

A gate driver is an integrated circuit configured to convert a low voltage (LV) switching signal into a high voltage (HV) signal suitable for driving a power transistor ON/OFF. Some systems (e.g., automotive systems, computer system) require the thermal conditions to be monitored in order to protect against faults that could lead to damage.

SUMMARY

In some aspects, the techniques described herein relate to a power switching system including: a switch module including a power transistor and a transistor temperature sensor configured to measure a transistor temperature of the power transistor; and a gate driver coupled to the switch module, the gate driver including: a gate-driver temperature sensor configured to measure a gate-driver temperature of the gate driver; a gate-driver temperature sense circuit configured to output an internal fault signal based on the gate-driver temperature; a transistor temperature sense circuit configured to receive the transistor temperature from the transistor temperature sensor and to output an external fault signal based on the transistor temperature; and a transceiver configured to communicate a combined signal corresponding to the internal fault signal and the external fault signal over a shared communication channel across an isolation barrier of the gate driver.

In some aspects, the techniques described herein relate to a power switching system, wherein the transceiver is configured to: communicate the combined signal over the shared communication channel to a low-voltage side of the gate driver, the combined signal including a first pulse train signal corresponding to the internal fault signal; and a second pulse train signal corresponding to the external fault signal; output a ready signal at a ready pin of the gate driver, the ready signal corresponding to the first pulse train signal; and output a sensed-temperature fault signal at a temperature fault pin of the gate driver, the sensed-temperature fault signal corresponding to the second pulse train signal.

In some aspects, the techniques described herein relate to a power switching system, wherein the gate-driver temperature sense circuit includes a comparator, the comparator configured to receive a voltage from the gate-driver temperature sensor at a first input and a thermal-shutdown threshold voltage at a second input, the comparator further configured to output the internal fault signal, wherein the internal fault signal is at a normal level when no thermal fault exists in the gate driver.

In some aspects, the techniques described herein relate to a power switching system, wherein the transistor temperature sense circuit includes a comparator, the comparator configured to receive a voltage from the transistor temperature sensor at a first input and a fault threshold voltage at a second input, the comparator further configured to output the external fault signal, wherein the external fault signal is at a fault level when a thermal fault exists in the power transistor.

In some aspects, the techniques described herein relate to a power switching system, wherein the transceiver includes: a ready encoder configured to generate a first pulse train signal while the internal fault signal is at the normal level and to not generate the first pulse train signal otherwise; a temperature fault encoder configured to generate a second pulse train signal while the transistor temperature is at the fault level and to not generate the second pulse train signal otherwise, the first pulse train signal having a lower bandwidth compared to the second pulse train signal and the second pulse train signal having a higher bandwidth compared to the first pulse train signal; and a multiplexer configured to combine outputs of the ready encoder and the temperature fault encoder to generate a combined signal and transmit the combined signal to a high-voltage side of a transformer.

In some aspects, the techniques described herein relate to a power switching system, wherein the transceiver further includes: a ready decoder configured to receive the combined signal from a low-voltage side of the transformer, the ready decoder including: a filter configured to isolate the first pulse train signal from the combined signal based on the lower bandwidth of the first pulse train signal; and a pulse detector configured to detect pulses in the first pulse train signal and to output a ready signal at a ready level while the pulses of the first pulse train signal are detected.

In some aspects, the techniques described herein relate to a power switching system, wherein the pulse detector is further configured to output the ready signal at a not-ready level after a plurality of pulses of the first pulse train signal are not detected.

In some aspects, the techniques described herein relate to a power switching system, wherein the transceiver further includes: a temperature fault decoder configured to receive the combined signal from a low-voltage side of the transformer, the temperature fault decoder including: a frequency detector configured to detect the higher bandwidth of the second pulse train signal and to output a fault signal at a fault level while the second pulse train signal is detected in the combined signal.

In some aspects, the techniques described herein relate to a power switching system, wherein the frequency detector is further configured to output the fault signal at a no-fault level while the second pulse train signal is not detected in the combined signal.

In some aspects, the techniques described herein relate to a power switching system, wherein: the transistor temperature sensor is a first transistor temperature sensor configured to measure a first transistor temperature of the power transistor, the switch module further including: a second transistor temperature sensor configured to measure a second transistor temperature of the power transistor; and the transistor temperature sense circuit is a first temperature sense circuit configured to receive the first transistor temperature from the first transistor temperature sensor and to output a first signal based on the first transistor temperature, the gate driver further including: a second temperature sense circuit configured to receive the second transistor temperature from the second transistor temperature sensor and to output a second signal based on the second transistor temperature;

and a logic gate configured to receive the first signal and the second signal and to output the external fault signal, the external fault signal having a level corresponding to a thermal fault when either the first signal or the second signal has a level corresponding to a thermal fault in the power transistor.

In some aspects, the techniques described herein relate to a power switching system, wherein the transceiver of the gate driver is a first transceiver, and the gate driver further includes: a transistor temperature monitor circuit configured to compare the transistor temperature to a ramp signal to output an external monitor signal, the external monitor signal being pulse width modulated (PWM) according to the transistor temperature; and a second transceiver configured to communicate the external monitor signal over a dedicated communication channel across the isolation barrier of the gate driver.

In some aspects, the techniques described herein relate to a power switching system, wherein the second transceiver further includes an inverter configured to invert the external monitor signal so that it is at a relatively low level more than it is at a relatively high level while the transistor temperature of the power transistor is in a normal temperature range for the power transistor to reduce a power consumed by the second transceiver.

In some aspects, the techniques described herein relate to a power switching system, wherein the gate driver is coupled to the transistor temperature sensor at a first temperature sense pin, the gate driver further including a second temperature sense pin and a disable circuit configured to disable the second temperature sense pin while it is not coupled to a second temperature sensor to reduce a power consumed by the gate driver.

In some aspects, the techniques described herein relate to a method for monitoring thermal conditions in a power switching system: receiving at a sense pin of a gate driver a transistor temperature of a power transistor; comparing the transistor temperature to a fault threshold to generate an external fault signal based on the comparison; measuring, by a gate-driver sensor of the gate driver, a gate-driver temperature; comparing the gate-driver temperature to a thermal-shutdown threshold to generate an internal fault signal based on the comparison; generating a first pulse train signal based on the internal fault signal; generating a second pulse train signal based on the external fault signal; combining the first pulse train signal and the second pulse train signal to generate a combined signal; and communicating the combined signal over a shared communication channel across an isolation barrier of the gate driver.

In some aspects, the techniques described herein relate to a method, further including: decoding the combined signal to generate a ready signal based on first pulse train signal; and decoding the combined signal to generate a sensed-temperature fault signal based on the second pulse train signal, wherein: the ready signal corresponds to a thermal fault condition of the gate-driver temperature and the sensed-temperature fault signal corresponds to a thermal fault condition of the power transistor.

In some aspects, the techniques described herein relate to a method, further including: comparing the transistor temperature to a ramp signal to generate an external monitor signal, the external monitor signal being a pulse width modulated (PWM) according to the transistor temperature; and communicating the external monitor signal over a dedicated communication channel across an isolation barrier of the gate driver.

In some aspects, the techniques described herein relate to a method, wherein communicating the external monitor signal over the dedicated communication channel includes: inverting the external monitor signal to reduce a power consumed communicating the external monitor signal across an isolation barrier of the gate driver.

In some aspects, the techniques described herein relate to a gate driver including: a gate-driver temperature sensor configured to measure a gate-driver temperature of the gate driver; a gate-driver temperature sense circuit configured to output an internal fault signal based on the gate-driver temperature; a temperature sensing and monitoring circuit including a transistor temperature sense circuit configured to receive a transistor temperature from a transistor temperature sensor coupled to the gate driver and to output an external fault signal based on the transistor temperature; and a transceiver configured to communicate a combined signal corresponding to the internal fault signal and the external fault signal over a shared communication channel across an isolation barrier of the gate driver.

In some aspects, the techniques described herein relate to a gate driver, wherein the transceiver is configured to: communicate the combined signal over the shared communication channel to a low-voltage side of the gate driver, the combined signal including a first pulse train signal corresponding to the internal fault signal; and a second pulse train signal corresponding to the external fault signal; output a ready signal at a ready pin of the gate driver, the ready signal corresponding to the first pulse train signal; and output a sensed-temperature fault signal at a temperature fault pin of the gate driver, the sensed-temperature fault signal corresponding to the second pulse train signal.

In some aspects, the techniques described herein relate to a gate driver, wherein the temperature sensing and monitoring circuit further includes a transistor temperature monitor circuit configured to generate a pulse width modulated signal corresponding to the transistor temperature, the pulse width modulated signal communicated over a dedicated communication channel to a low-voltage side of the gate driver.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
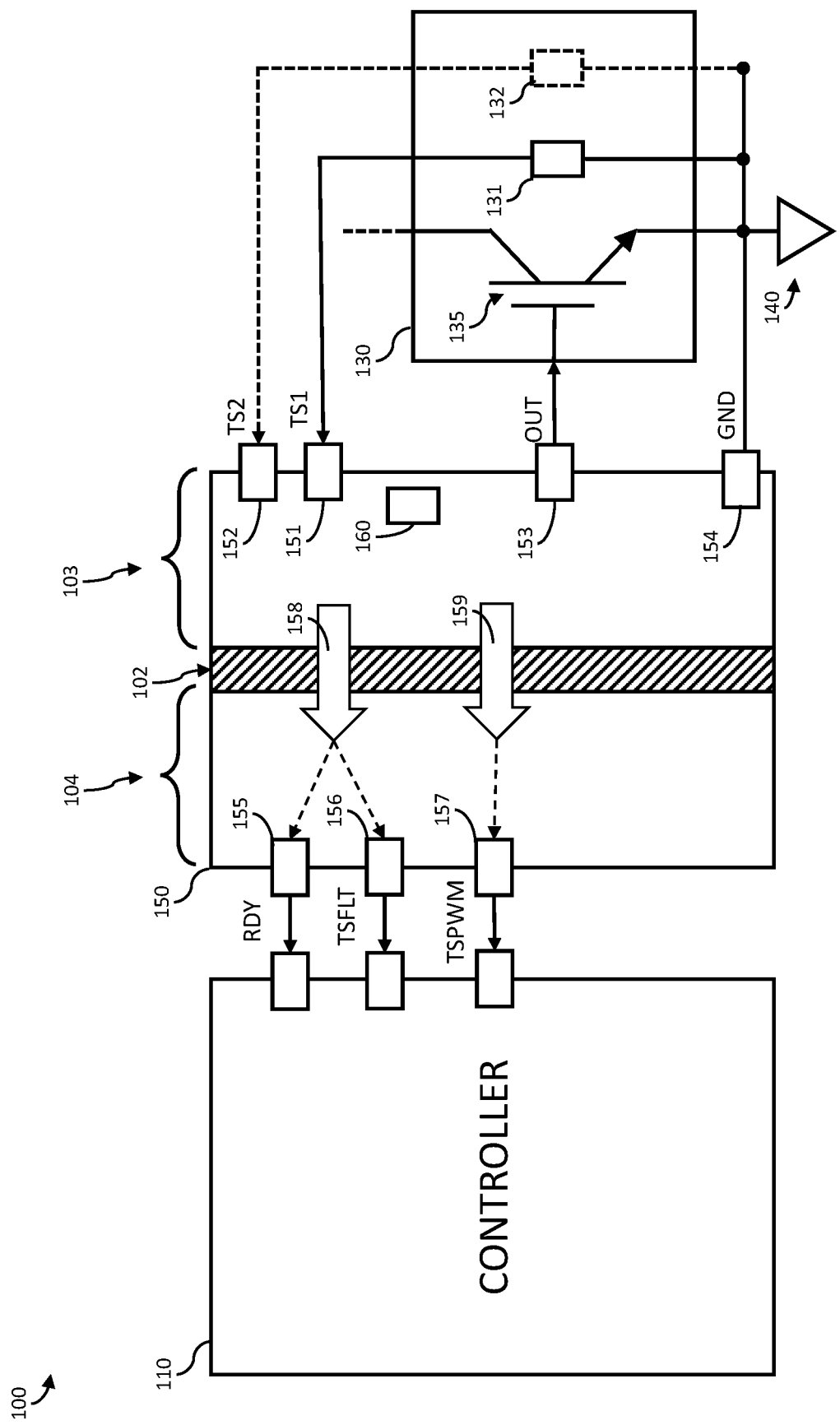
FIG. 1 is a block diagram schematically illustrating a power switching system according to a possible implementation of the present disclosure.

Switching large currents can be accomplished using a power transistor. The power transistor may be a metal oxide semiconductor field effect transistor (MOSFET) or an insulated gate bipolar transistor (IGBT). The power transistor may be fabricated using silicon (Si) or silicon carbide (SiC) processes. The power transistor may be configured in an ON condition to conduct current or an OFF condition to block current in a high voltage (HV) circuit. The state of the power transistor may be set by a gate driver coupled to a controlling terminal (e.g., gate terminal) of the power transistor.

The gate driver is configured to translate low-voltage (LV) signals from a controller into high-voltage (HV) signals for the power transistor. Accordingly, the gate driver can have a low-voltage side that includes low-voltage circuits/devices handling signals relative to a low-voltage ground and a high-voltage side that include high-voltage circuits/devices having signals relative to a high-voltage (i.e., power) ground. An isolation barrier is included in the gate driver to separate these grounds so that the low-voltage electronics of the low-voltage side are not damaged by the high-voltage signals of the high-voltage side. In other words, the isolation barrier may provide galvanic isolation between the low-voltage side and a high-voltage side of the gate driver. Communication of signals through (i.e., across) the isolation barrier may be carried out using inductive coupling of magnetic signals. A transformer may be configured to provide the inductive coupling and the isolation barrier. Communication of signals through (i.e., across) the isolation barrier may also be carried out using capacitive coupling of electrical signals. A capacitor (or capacitors) may be configured to provide the capacitive coupling and the isolation barrier. The disclosed techniques may use either of these implementations.

The isolation barrier may be implemented as a transformer having a primary winding on a LV side of the gate driver and a secondary winding on a HV side of the gate driver. The transformer may magnetically couple signals, which are within a frequency bandwidth of the transformer, between the windings. Accordingly, the gate driver may include a transmitter that is configured to encode (e.g., modulate) signals so that they are of a bandwidth (e.g., frequency) suitable for magnetic coupling and a receiver that is configured to decode the encoded signals after they have been magnetically coupled. The transmitter and the receiver may be collectively referred to as a transceiver.

In recent years, a demand for gate drivers to perform more functions than switching has developed. For example, gate drivers may be expected to perform fault monitoring and reporting functions. These added functions can increase the number of signals that must be communicated across the isolation barrier, which can increase a size of the gate driver and/or can increase a power consumed by the gate driver. To make matters worse, some implementations can require redundant fault sensing. One technical problem in meeting these demands is maintaining a modest size, cost, and complexity of the gate driver. The present disclosure describes a gate driver that reduces the complexity and power consumption of its thermal monitoring (i.e., temperature monitoring), fault detection, and thermal reporting circuitry.

High current levels switched by the power transistor can be damaging or dangerous when a malfunction (i.e., fault) in the operation of the power transistor occurs. A high temperature of the power transistor and/or the gate driver may be indicative of a malfunction. Accordingly, temperature sensors may be included in a power system to measure the power transistor and/or the gate driver. A gate driver may be configured to generate a fault when one (or more) of the measured temperatures exceeds a threshold and communicate the fault to a controller, which may be programmed to take an action to reduce the temperature or stop the operation altogether. In some implementations, a continuous measurement of the temperature of the power transistor is needed in addition to the fault signals for diagnostics. The present disclosure further describes a gate driver that can provide a redundancy between real-time monitoring of temperature and over-temperature (i.e., fault) detection.

A gate driver may be used in a variety of applications, such as automotive or computing. Each application may have different requirements for temperature safety. For example, some applications may require multiple (e.g., two) temperature sensors. Using redundant sensors to measure the temperature of the power transistor can increase a certainty that a fault event can be detected and accommodated before becoming severe. This added functionality requires the gate driver to consume more power, which is undesirable when used in applications that do not have such strict requirements. The present disclosure further describes a gate driver that can reduce power consumption in applications that do not require more than one temperature sensor. In other words, the disclosed gate driver can automatically detect if a temperature sensor is absent and reduce a power consumed by the gate driver in response to this detection.

FIG. 1 is a block diagram schematically illustrating a power switching system according to a possible implementation of the present disclosure. The power switching system 100 includes a controller 110, a gate driver 150, and a switch module 130. The controller 110 can be configured to transmit LV switching signals to the gate driver 150 to control a power transistor 135 in a ON condition or an OFF condition. Additionally, the controller 110 can be configured to receive feedback signals from the gate driver to indicate a condition (e.g., thermal fault condition) of the gate driver 150 and/or the power transistor 135. These feedback signals can be communicated between the gate driver 150 and the controller 110 in a pin-to-pin communication. In other words, the feedback signals do not require the digitizing and communicating circuitry required to communicate this information back over a digital bus. The feedback signals can be signals having a HIGH level or a LOW level (i.e., binary) to indicate a status or can be an analog signal (e.g., voltage) corresponding to a value in a continuous range.

The gate driver 150 may be configured to transmit a ready signal (RDY) at a ready pin 155 to the controller 110. A level of the ready signal indicates if the gate driver 150 is in a thermal fault condition (i.e., is not ready for operation) or is not in a thermal fault condition (i.e., is ready for operation). A thermal fault condition can occur when the gate driver 150 is at a temperature outside (e.g., above) a normal operating range. For example, if the temperature of the gate driver is higher than a maximum temperature (i.e., higher than a thermal-shutdown (TSD) threshold), the RDY signal at the ready pin 155 may indicate that a thermal fault exists in the gate driver. In a possible implementation, the RDY signal is HIGH for a normal gate driver temperature and LOW for an abnormal (i.e., high) gate driver temperature (i.e., fault).

The gate driver 150 may be further configured to transmit a sensed-temperature fault signal (TSFLT) at a fault pin 156 to the controller 110. A level of the sensed-temperature fault signal indicates if the power transistor 135 is in a thermal fault condition or is not in a thermal fault condition. A thermal fault condition can occur when the power transistor 135 is at a temperature outside (e.g., above) a normal operating range (e.g., $100°$ C.$\leq T \leq 175°$ C.). For example, if the transistor temperature of the power transistor 135 is higher than a maximum temperature (i.e., above a fault threshold), then the TSFLT signal at the fault pin 156 may indicate that a thermal fault exists in the switch module 130 (i.e., in the power transistor 135). In a possible implementation, the TSFLT signal is HIGH for a normal transistor temperature and LOW for an abnormal (i.e., high) transistor temperature.

The gate driver 150 may be further configured to transmit a transistor temperature signal (TSPWM) at a pulse width modulation output pin (i.e., PWM output pin 157) to the controller 110. The transistor temperature signal (TSPWM) may be a square wave signal at a frequency (e.g., 10 kilohertz (KHz)) that is pulse width modulated to have a duty cycle that corresponds to a first signal (i.e., first transistor temperature (TS1)) received at a first temperature sense pin 151 or a second signal (i.e., second transistor temperature TS2) received at a second temperature sense pin 152. In a possible implementation, a range of temperatures from $-40°$ C. to $+175°$ C. may be mapped to a range of duty cycles from 10% to 90%. Accordingly, the controller may be configured to continuously measure the duty cycle of the TSPWM signal to monitor the temperature of the power transistor 135.

The gate driver 150 includes an isolation barrier 102 that separates a high-voltage side 103 of the gate driver 150 and a low-voltage side 104 of the gate driver. Signals from the high-voltage side of the gate driver that are output at the ready pin 155 and the fault pin 156 can be communicated over a shared communication channel 158 across the isolation barrier 102, while the signal from the high-voltage side of the gate driver that is output at the PWM output pin 157 can be communicated over a dedicated communication channel 159 across the isolation barrier 102 of the gate driver 150.

The first temperature sense pin 151 may be coupled to a first transistor temperature sensor 131 of the switch module 130. The first transistor temperature sensor 131 may be configured to measure a first transistor temperature (i.e., TS1) of the power transistor 135. The second temperature sense pin 152 is optionally coupled to a second transistor temperature sensor 132 of the switch module 130. The second transistor temperature sensor 132 may be configured to measure a second transistor temperature (i.e., TS2) of the power transistor 135. The first transistor temperature sensor 131 and the second transistor temperature sensor 132 may be the same type of sensor (e.g., thermistor, NTC, etc.) or can be different. Further, the second transistor temperature sensor 132 may be integrated with the switch module 130 or may be a unitary device coupled to the switch module 130 or other circuitry in the power switching system 100.

The gate driver 150 may include a gate-driver temperature sensor 160 configured to measure a gate driver temperature of the gate driver 150. The gate-driver temperature sensor 160 may be integrated with other circuitry of the gate driver 150 in a common package (i.e., integrated circuit (IC)). Fault signals (e.g., thermal shutdown, IGBT temperature detection) determined based on signals from the first temperature sense pin 151 and the gate-driver temperature sensor 160 (and optionally the second temperature sense pin) can be communicated across the isolation barrier 102 via the shared communication channel 158. Additionally, a real-time temperature based on a signal at the first temperature sense pin (and optionally the second temperature sense pin) may be communicated across the isolation barrier 102 via a dedicated communication channel 159. Accordingly, the disclosed approach describes multiple communication paths for temperature information which provides an added layer of safety to the system.

The power switching system 100 shown in FIG. 1, illustrates that the switch module 130 may be coupled to an output pin 153 of the gate driver 150 so that output signals (OUT) from the gate driver can control the power transistor 135 (e.g., IGBT) ON/OFF. The switch module 130 may be further coupled to a ground pin 154. The gate driver 150 and the switch module 130 are grounded to a power ground 140.

Figure 2:
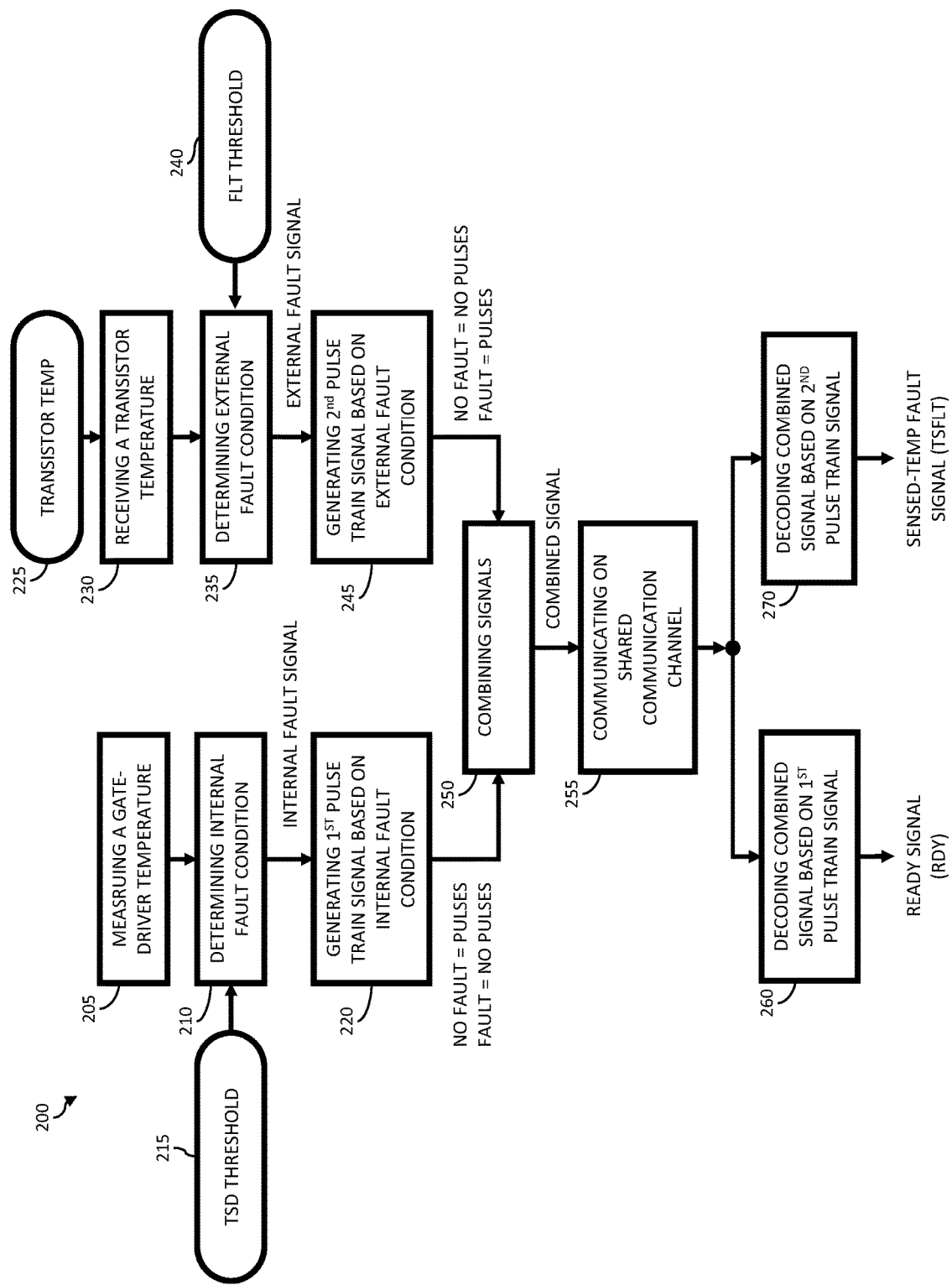
FIG. 2 is flow chart of a method for monitoring thermal conditions in a power switching system according to a possible implementation of the present disclosure.

FIG. 2 illustrates a method for monitoring thermal conditions in a power switching system. For example, the gate driver 150 may be configured to perform the operations of the method. Accordingly, the temperatures and faults that may be referred to as internal when the correspond to circuitry within the gate driver 150 and may be referred to as external when they correspond to circuitry coupled externally to the gate driver 150 (e.g., the switch module 130).

The method 200 includes measuring 205 a gate-driver temperature, such as a from a gate-driver temperature sensor 160. The method 200 further includes determining 210 an internal fault condition by comparing the gate-driver temperature to a thermal-shutdown (TSD) threshold 215. The comparison can result in an internal fault signal. The internal fault signal may have two levels (e.g., binary levels) corresponding to the presence/absence of an internal fault condition. The method 200 further includes generating 220 a first pulse train signal based on the internal fault signal. For example, pulses may be generated while no internal fault condition exists (i.e., during a normal condition) and not transmitted while an internal fault condition exists (i.e., during a thermal shut down).

The method 200 further includes receiving 230 a transistor temperature 225, such as a first transistor temperature (i.e., TS1) from a first transistor temperature sensor 131 at a first temperature sense pin 151. The method 200 further includes determining 235 an external fault condition by comparing the transistor temperature 225 to a fault threshold 240. The comparison can result in an external fault signal. The external fault signal may have two levels (e.g., binary levels) corresponding to the presence/absence of an external fault condition. The method 200 further includes generating 245 a second pulse train signal based on the external fault signal. For example, pulses may be generated while an external fault condition exists and not transmitted while no external fault condition exists (i.e., during a normal condition).

The method 200 further includes combining 250 the first pulse train signal and the second pulse train signal to form a combined signal. The first pulse train signal and the second pulse train signal may have different bandwidths. For example, the pulses of the first pulse train signal may have a first pulse width that is longer than a second pulse width of pulses of the second pulse train signal. Further a first period of the first pulse train signal may be longer than a second period of the second pulse train signal. In a possible implementation, the first pulse train signal can include a first pulse width of 65 nanoseconds (65 ns) and a first period of 3 microseconds (3 µs), while the second pulse train signal can include a second pulse width of 10 ns and a second period of 150 ns. Accordingly, the first pulse train signal may have a lower bandwidth than the second pulse train signal. The combined signal may include pulses of the first pulse width and first period as well as pulses of the second pulse width and second period.

The method 200 further includes communicating 255 the combined signal over the shared communication channel 158. This may advantageously simplify the electronics necessary for communicating the two signals from the high-voltage side 103 to the low-voltage side 104 of the gate driver 150.

The method 200 further includes decoding 260 the combined signal based on the first pulse train signal. The decoding 260 may include filtering the combined signal to recover the first pulse train signal from the combined signal. The decoding 260 may further include detecting pulses to generate the ready signal (RDY) at the ready pin 155.

The method 200 further includes decoding 270 the combined signal based on the second pulse train signal. The decoding 270 may include detecting high frequencies in the combined signal to determine when the second pulse train signal is present in the combined signal. Based on this determination the decoding may generate the sensed-temperature fault signal (TSFLT) at the fault pin 156.

Figure 3:
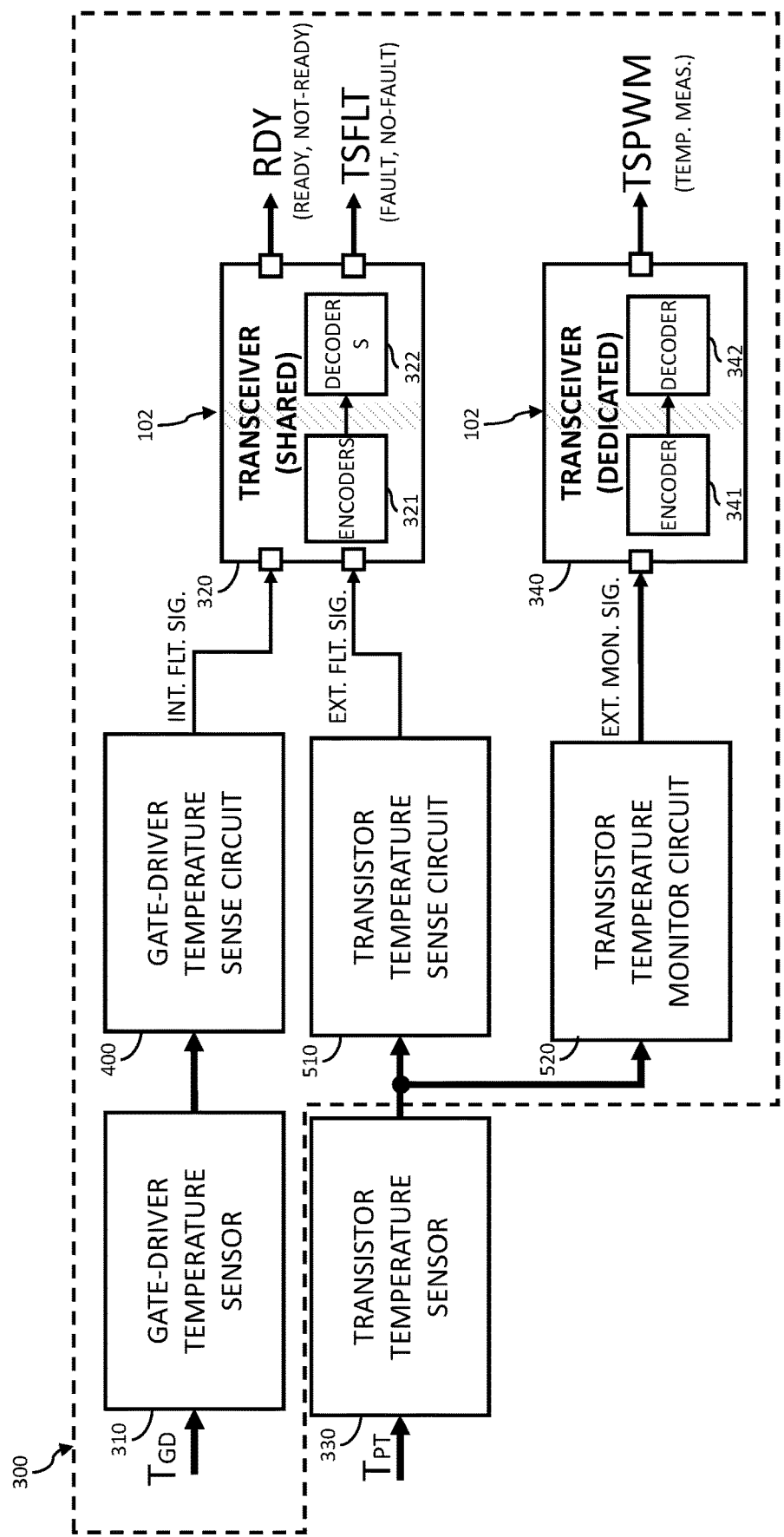
FIG. 3 is a block diagram schematically illustrating a circuitry of a power switching system according to a possible implementation of the present disclosure.

FIG. 3 is a block diagram schematically illustrating a circuitry of a power switching system according to a possible implementation of the present disclosure. The block diagram include devices and circuits of a gate driver 300 that can be configured to perform the operations of the method described above. The gate driver 300 may include a gate-driver temperature sensor 310 configured to measure a gate-driver temperature ($T_{GD}$). A signal (e.g., voltage) corresponding to the gate-driver temperature is received by a gate-driver temperature sense circuit 400 that is configured to output an internal fault signal based on the gated driver temperature.

Figure 4:
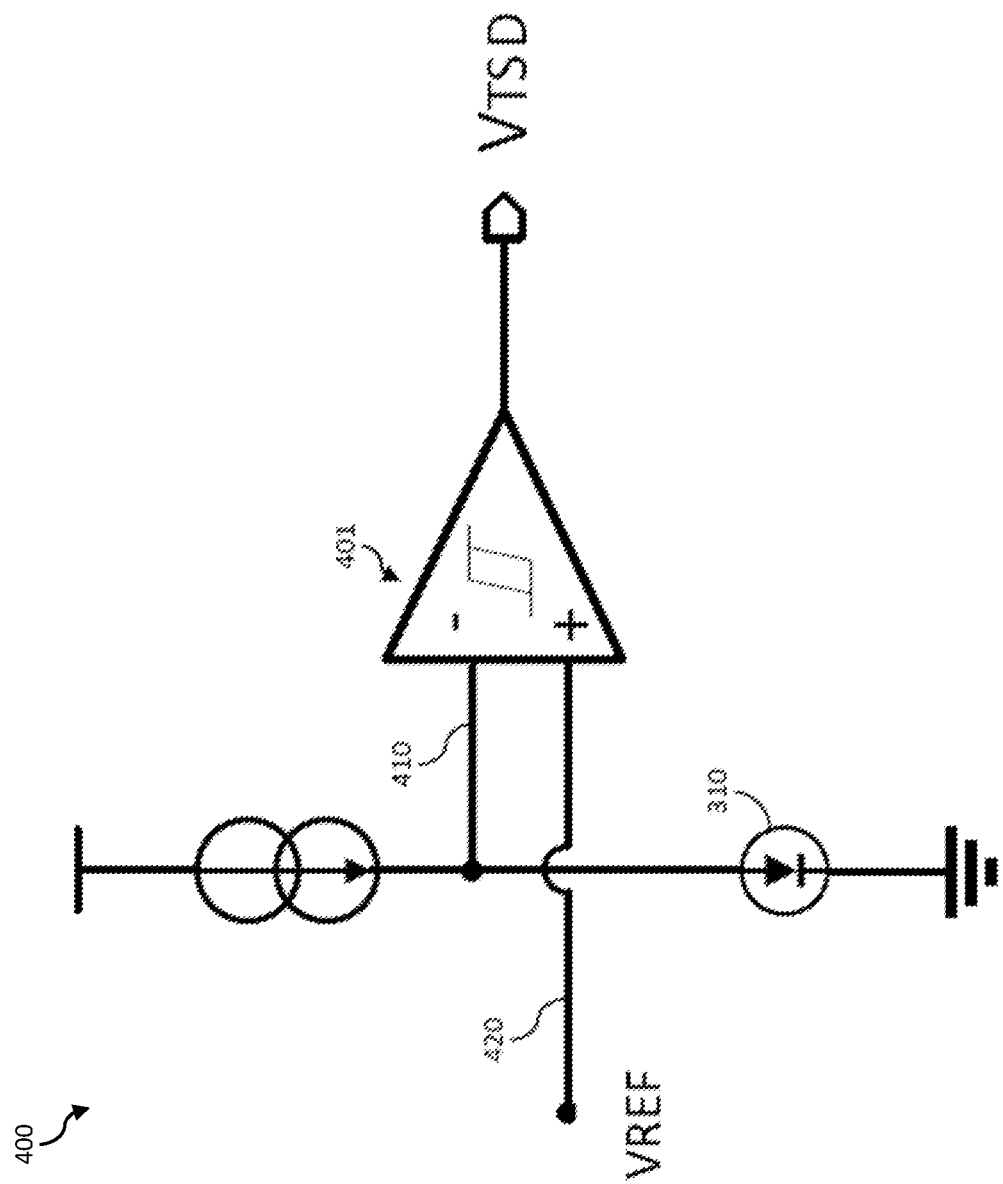
FIG. 4 is a schematic of a gate-driver temperature sense circuit according to a possible implementation of the present disclosure.

FIG. 4 is a schematic of a gate-driver temperature sense circuit according to a possible implementation of the present disclosure. The gate-driver temperature sense circuit 400 can include a comparator 401 configured to receive a voltage from the gate-driver temperature sensor 310 at a first input 410 and a thermal-shutdown threshold voltage (VREF) at a second input 420. The thermal-shutdown threshold voltage may be generated using a variety circuits and devices (e.g., voltage divider, current/resistor, bandgap reference, etc.). The comparator is configured to output the internal fault signal. The internal fault signal can be a voltage ($V_{TSD}$) that is at a LOW level when the voltage from the gate-driver temperature sensor is below the thermal-shutdown threshold voltage. Further, the voltage ($V_{TSD}$) can be at a HIGH level when the voltage from the gate-driver temperature sensor is above the thermal-shutdown threshold voltage.

Returning to FIG. 3, the gate driver 300 further includes a transistor temperature sense circuit 510 and a transistor temperature monitor circuit 520 that are configured to receive a transistor temperature from a transistor temperature sensor 330. The transistor temperature sense circuit can be configured to output an external fault signal based on the transistor temperature, while the transistor temperature monitor circuit 520 can be configured to output an external monitor signal based on the transistor temperature.

Figure 5:
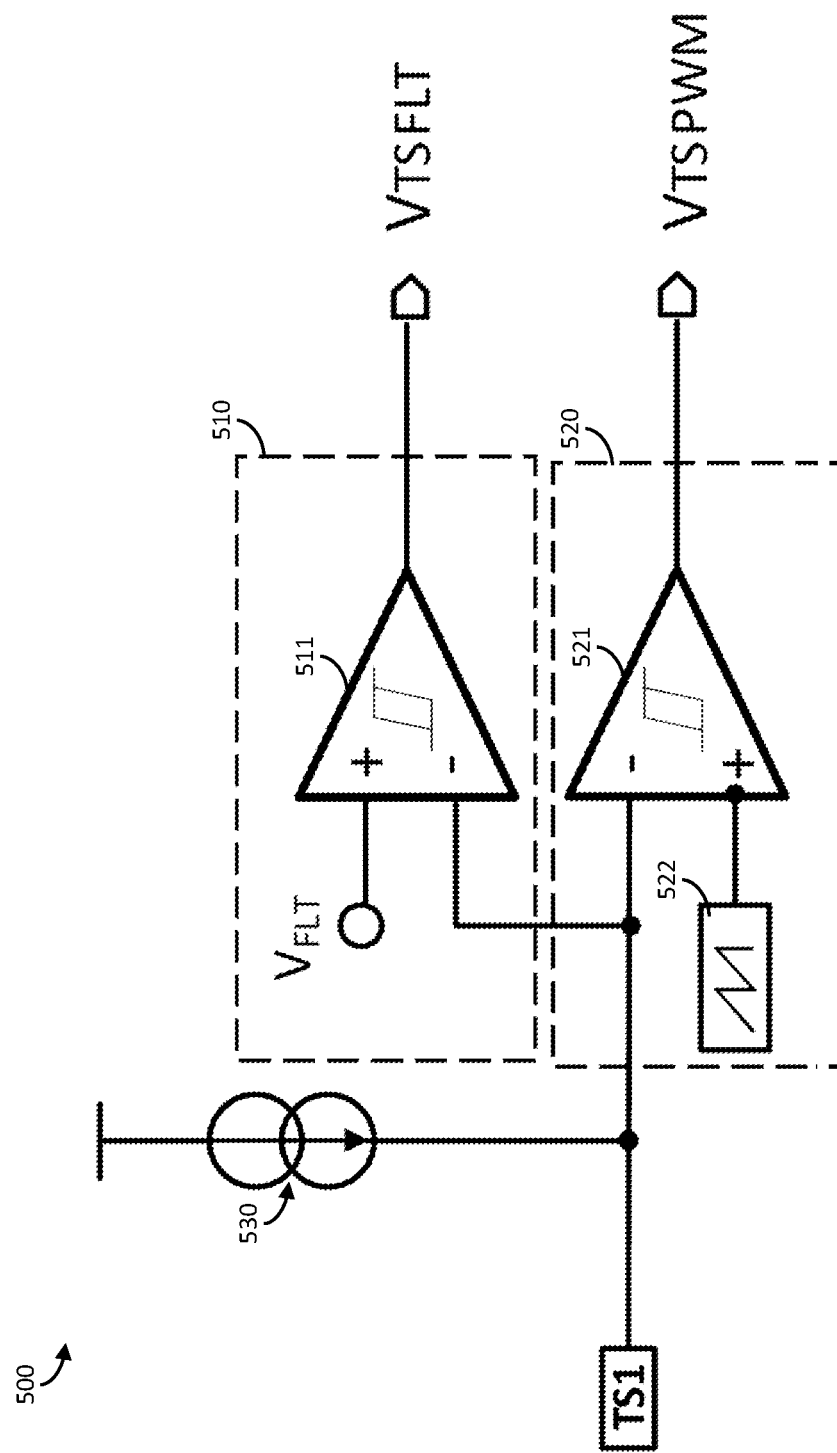
FIG. 5 is a schematic illustrating a transistor temperature sensing and monitoring circuit according to an implementation of the present disclosure.

FIG. 5 is a schematic illustrating a transistor temperature sensing and monitoring circuit according to an implementation of the present disclosure. The temperature sensing and monitoring circuit 500 includes a transistor temperature sense circuit 510 and a transistor temperature monitoring circuit 520. The temperature sensing and monitoring circuit 500 can be coupled to a first temperature sense pin or a second temperature sense pin of the gate driver to receive a transistor temperature (e.g., TS1, TS2) from a transistor temperature sensor (e.g., first transistor temperature sensor 131, second transistor temperature sensor 132). When two temperature sensors are included in the power switching system, the gate driver may include a temperature sensing and monitoring circuit 500 for each transistor temperature sensor.

The transistor temperature sense circuit 510 of the temperature sensing and monitoring circuit 500 includes a first comparator 511. The first comparator is coupled to the first temperature sense pin 151 (or the second temperature sense pin 152) of the gate driver. The first comparator 511 can be configured to receive a signal corresponding to the transistor temperature from the first transistor temperature sensor 131 (or the second transistor temperature sensor 132) at a first input. When the first transistor temperature sensor 131 (or the second transistor temperature sensor 132) is implemented as a thermistor, the signal can be a voltage that decreases as the transistor temperature increases. The first comparator 511 may be configured to compare this voltage to a fault threshold voltage ($V_{FLT}$) received at a second input of the first comparator 511. The first comparator 511 may be further configured to output the external fault signal. The external fault signal may be a voltage ($V_{TSFLT}$) that is at a HIGH level when the voltage from the first transistor temperature sensor 131 (or second transistor temperature sensor 132) is below the fault threshold voltage ($V_{FLT}$). In this case, the HIGH level indicates a thermal fault in the power transistor because a low voltage output by a thermistor corresponds to a high physical temperature. In practice, the signal levels could be reversed. In general, disclosure herein of particular signal levels are provided to help understanding in how to perform possible implementation and should not be considered limiting to the invention.

The transistor temperature monitoring circuit 520 of the temperature sensing and monitoring circuit 500 includes a second comparator 521. The second comparator 521 is coupled to the first temperature sense pin 151 (or the second temperature sense pin 152) of the gate driver. The second comparator 521 can be configured to receive a signal corresponding to the transistor temperature from the first transistor temperature sensor 131 (or the second transistor temperature sensor 132) at a first input of the second comparator 521. The signal can be a voltage that decreases as the transistor temperature increases when the first transistor temperature sensor 131 (or the second transistor temperature sensor 132) is implemented as a thermistor. Accordingly, the second comparator 521 may be configured to compare this voltage to a ramp signal 522 to generate an external monitor signal. The external monitor signal can be a voltage ($V_{TSPWM}$) that is pulse width modulated according to the comparison.

Figure 6:
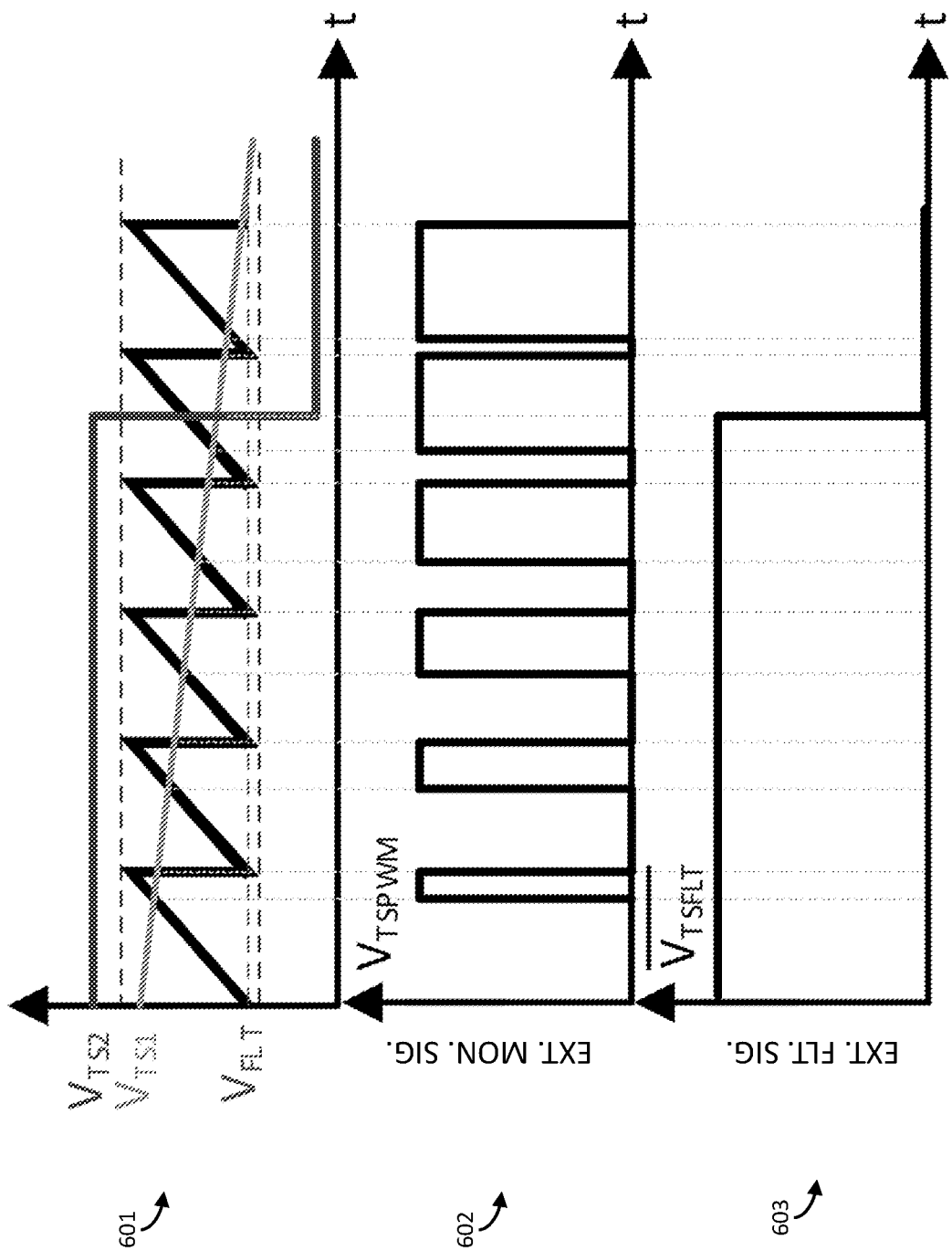
FIG. 6 illustrates signals from a transistor temperature sense circuit and a transistor temperature monitor circuit for a first temperature sense input and a second temperature sense input of a gate driver according to a possible implementation of the present disclosure.

FIG. 6 illustrates signals from a transistor temperature sense circuit and a transistor temperature monitor circuit for a first temperature sense input and a second temperature sense input of a gate driver according to a possible implementation of the present disclosure. In a first graph 601, a voltage from a first transistor temperature sensor ($V_{TS1}$) is compared to a ramp signal to generate a PWM voltage ($V_{TSPWM}$) (i.e., external monitor signal) that is at a HIGH level when ramp signal is greater than $V_{TS1}$. As shown in a second graph 602, the duty cycle of the PWM voltage increases as the voltage $V_{TS1}$ decreases. In other words, the duty cycle increases as the temperature of the transistor increases. In a possible implementation, a duty cycle above a maximum duty cycle can trigger a fault.

In the first graph 601, a voltage from a second transistor temperature sensor ($V_{TS2}$) is compared to a fault threshold voltage ($V_{FLT}$). When $V_{TS2}$ drops below the fault threshold voltage, then the external fault signal may change states. As shown in a third graph 603, the inverse external fault signal may change from a no-fault state (i.e., HIGH) to a fault state (i.e., LOW). Again, the levels corresponding to a fault/no-fault state may be changed to match the logic of a particular implementation.

Returning to FIG. 3, The gate driver 300 further includes a first transceiver 320 configured to transmit the internal fault signal from the gate-driver temperature sense circuit 400 and the external fault signal from the transistor temperature sense circuit 510 across the isolation barrier 102 over a shared communication channel. The first transceiver 320 (i.e., shared transceiver) may include a plurality of encoders 321 to process (e.g., modulate) the signals for transmission and a plurality of decoders 322 to process (e.g., detect) the received signals. The first transceiver 320 may output a ready signal (RDY) at a ready pin 155. The ready signal (RDY) may be at a level indicating that the gate driver is at a normal operating temperature or a not-ready level indicating that the gate driver is not at a normal operating temperature (i.e., over temperature condition). The first transceiver 320 may also output a fault signal at a fault pin 156. The fault signal (TSFLT) may be at a level indicating that the power transistor 135 is at a normal operating temperature or a not-ready level indicating that the power transistor is not at a normal operating temperature (e.g., over temperature condition).

As shown in FIG. 3, the gate driver 300 further includes a second transceiver 340 configured to transmit the external monitor signal from the transistor temperature monitor circuit 520 across the isolation barrier 102 over a dedicated communication channel. The second transceiver 340 (i.e., dedicated transceiver) may include an encoder 341 to process (e.g., modulate) the signal for transmission and a decoder 342 to process (e.g., detect) the received signals. The second transceiver 340 may output a temperature monitor signal (i.e., PWM signal) at a PWM output pin 157. The PWM signal (TSPWM) may have a duty cycle corresponding to the temperature measurement of the power transistor.

Figure 7:
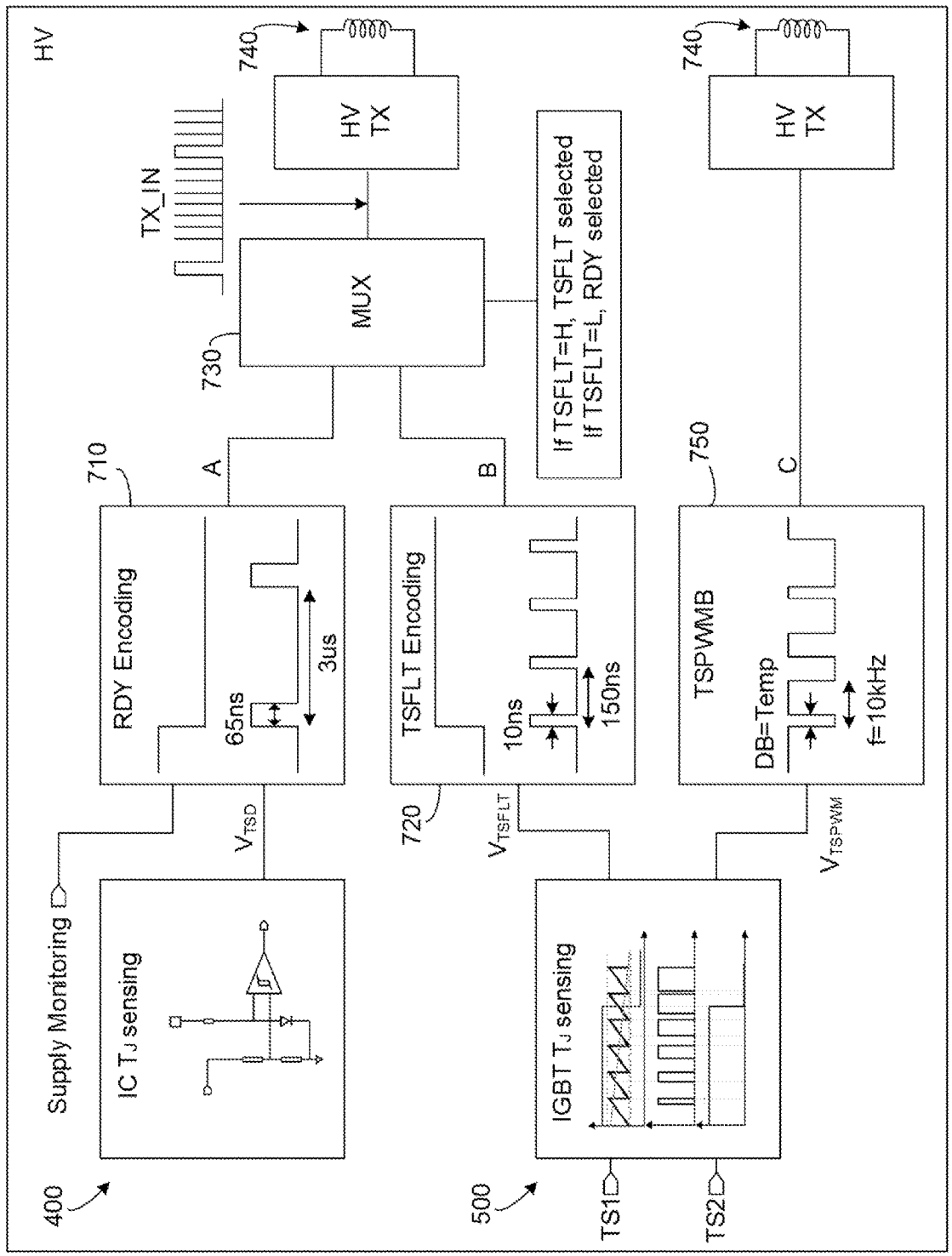
FIG. 7 illustrates a block diagram of a portion of a high-voltage side of a gate driver for a power switching system according to a possible implementation of the present disclosure.

FIG. 7 illustrates a block diagram of a portion of a high-voltage side of a gate driver for a power switching system according to a possible implementation of the present disclosure. FIG. 7 includes a transmitter portion of the first transceiver 320. The transmitter portion of the first transceiver includes a ready encoder 710 configured to generate a first pulse train signal while the internal fault signal ($V_{TSD}$) is at a normal level and to not generate the fault signal otherwise. The transmitter portion of the first transceiver further includes a temperature fault encoder 720 configured to generate a second pulse train signal while the external fault signal ($V_{TSFLT}$) is at a fault level and to not generate the second pulse train otherwise. The transmitter portion of the first transceiver further includes a multiplexer 730. The multiplexer is configured to generate a combined signal (TX_IN) from the first pulse train signal (A) and the second pulse train signal (B). For example, the multiplexer 730 may be configured to select the second pulse train signal when the external fault signal ($V_{TSFLT}$) is at a HIGH level and select the first pulse train signal when the external fault signal ($V_{TSFLT}$) is at a LOW level. The transmitter can then transmit (HV TX) the combined signal to a high voltage winding 740 (i.e., side) of a first transformer.

FIG. 7 includes a transmitter portion of the second transceiver 340. The transmitter portion of the second transceiver includes a PWM inverter (i.e., inverter 750) configured to invert the eternal monitor signal so that it is at a relatively low level more than it is at a relatively high level while the transistor temperature is in a typical temperature range (e.g., 100° C.≤T≤175° C.), which may correspond to a duty cycle in a typical duty range (e.g., 67%≤DUTY≤90%). The inverter 750 can reduce the current consumed by the transmitter portion of the second transceiver because less current can be consumed at a LOW level than at a HIGH level. In other words, the transistor temperature monitor circuit 520 may output a PWM signal that is at a HIGH level for a majority of the time during operation in a normal temperature range, and the inverter can output the inverse of the PWM signal so that it is at a LOW level for a majority of the time. The inverted PWM signal (C) conveys the same information but requires less power. The transmitter can then transmit (HV TX) the inverted PWM signal (C) to a high voltage winding 760 (i.e., side) of a second transformer.

Figure 8:
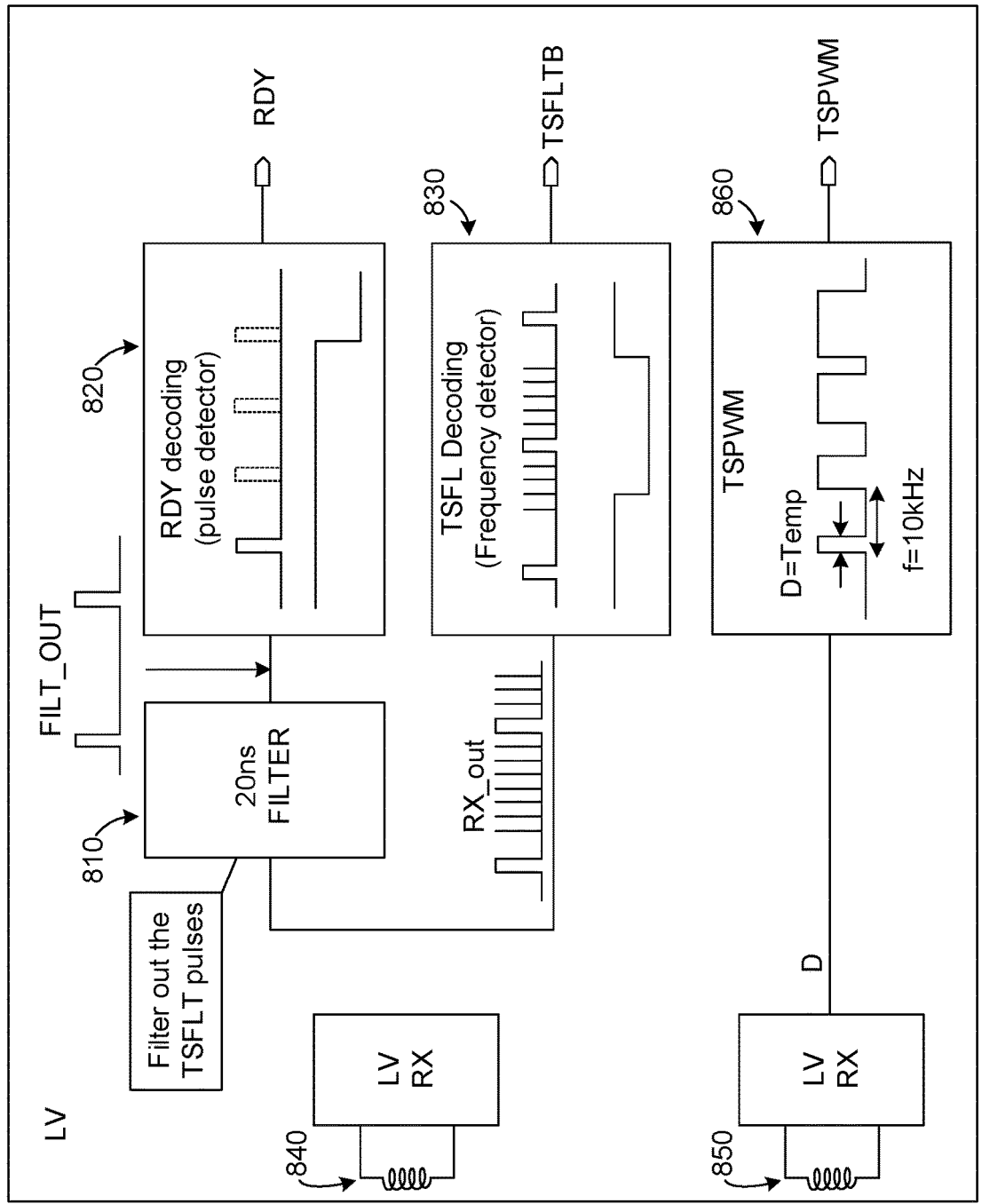
FIG. 8 illustrates a block diagram of a portion of a low-voltage side of a gate driver for a power switching system according to a possible implementation of the present disclosure.

FIG. 8 illustrates a block diagram of a portion of a low-voltage side of a gate driver for a power switching system according to a possible implementation of the present disclosure. FIG. 8 includes a receiver portion of the first transceiver 320. The receiver portion of the first transceiver receives the combined signal from a low voltage winding 840 of the first transformer. The combined signal is then split into two channels.

A first channel includes a ready decoder including a filter 810 that is configured to output a signal (FILT_OUT) in which the first pulse train signal is recovered (i.e., isolated) from the combined signal. For example, the filter 810 may have a relatively high time constant (e.g., 20 ns) so that the lower bandwidth first pulse train signal can pass through the filter 810 while the higher bandwidth second pulse train signal is blocked (i.e., attenuated). In other words, the filter 810 may be a low pass filter. The ready decoder further includes a decoder implemented as a pulse detector 820 configured to detect pulses in the first pulse train signal. The pulse detector 820 may output a ready signal while pulses are detected and output a not-ready signal after a number (e.g., 3) of missed (i.e., absent) pulses.

A second channel includes a temperature fault decoder configured to receive the combined signal (RX_OUT) from the low-voltage winding 840 of the first transformer. The temperature fault decoder includes a decoder implemented as a frequency detector 830 configured to detect the high bandwidth of the second pulse train signal and to output a fault signal at a fault level while the second pulse train signal is detected in the combined signal.

FIG. 8 further includes a receiver portion of the second transceiver 340. The receiver portion of the second transceiver receives the inverted PWM signal from a low voltage winding 850 of the second transformer. The receiver portion of the second transceiver includes a PWM decoder 860 configured to recover the PWM signal by inverting the inverted PWM signal.

As shown in FIG. 5, the gate driver includes a current source 530 for reading the signal at a temperature sense pin. While the gate driver may include multiple (e.g., two) temperature sense pins for redundant sensing, not all implementations will use all of the temperature sense pins. In these implementations, the current source associated with an unused temperature sense pin may consume power (current) unnecessarily. As a result, the gate driver can include a disable circuit configured to disable a temperature sense pin while it is not coupled to a temperature sensor to reduce a power consumed by the gate driver.

Figure 9:
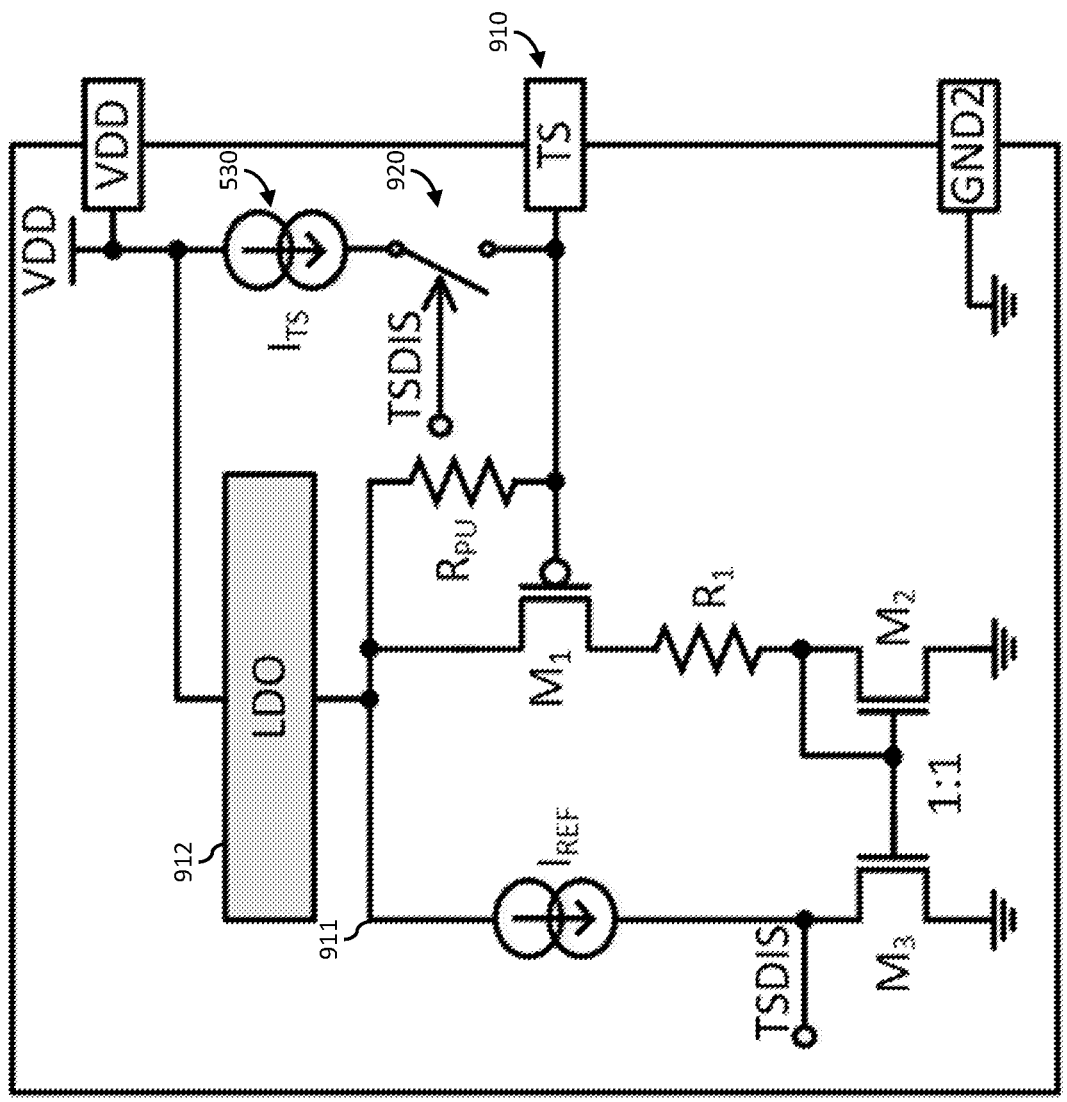
FIG. 9 is schematic of a disable circuit for a temperature sensing pin of a gate driver according to a possible implementation of the present disclosure.

FIG. 9 is schematic of a disable circuit for a temperature sensing pin of a gate driver according to a possible implementation of the present disclosure. The disable circuit includes a switch 920 configured to decouple the current source 530 from a temperature sense pin 910 when the pin is not coupled to a sensor.

The disable circuit can be coupled to a high voltage supply rail (e.g., 15V), while the signal at the temperature sense pin 910 can be a low voltage (e.g., 5V). When the temperature sense pin is uncoupled, it can voltage float to the high voltage supply rail through the current source 530. To prevent this, the disable circuit includes low voltage rail 911 supplied by a low dropout voltage regulator (LDO 912). The low voltage rail 911 is coupled to the temperature sense pin 910 through a pull up resistor ($R_{PU}$). In this case, a floating temperature sense pin is pulled up to the low-voltage rail 911. In this condition, a disable voltage (TSDIS) is pulled to a HIGH voltage, which opens the switch 920. When the temperature sense pin is not floating (i.e., is coupled to a sensor), however, the disable voltage (TSDIS) is pulled to a LOW voltage, which closes the switch 920.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A power switching system comprising:
    a switch module including a power transistor and a transistor temperature sensor configured to measure a transistor temperature of the power transistor; and
    a gate driver coupled to the switch module, the gate driver including:
        a gate-driver temperature sensor configured to measure a gate-driver temperature of the gate driver;
        a gate-driver temperature sense circuit configured to output a first pulse train signal corresponding to an internal fault signal based on the gate-driver temperature;
        a transistor temperature sense circuit configured to receive the transistor temperature from the transistor temperature sensor and to output a second pulse train signal corresponding to an external fault signal based on the transistor temperature; and
        a transceiver configured to communicate a combined signal including the first pulse train signal and the second pulse train signal over a shared communication channel across an isolation barrier of the gate driver.

2. The power switching system according to claim 1, wherein the transceiver is configured to:
communicate the combined signal over the shared communication channel to a low-voltage side of the gate driver;
output a ready signal at a ready pin of the gate driver, the ready signal corresponding to the first pulse train signal; and
output a sensed-temperature fault signal at a temperature fault pin of the gate driver, the sensed-temperature fault signal corresponding to the second pulse train signal.

3. The power switching system according to claim 1, wherein the gate-driver temperature sense circuit includes a comparator, the comparator configured to receive a voltage from the gate-driver temperature sensor at a first input and a thermal-shutdown threshold voltage at a second input, the comparator further configured to output the internal fault signal, wherein the internal fault signal is at a normal level when no thermal fault exists in the gate driver.

4. The power switching system according to claim 3, wherein the transistor temperature sense circuit includes a comparator, the comparator configured to receive a voltage from the transistor temperature sensor at a first input and a fault threshold voltage at a second input, the comparator further configured to output the external fault signal, wherein the external fault signal is at a fault level when a thermal fault exists in the power transistor.

5. The power switching system according to claim 4, wherein the transceiver includes:
a ready encoder configured to generate a first pulse train signal while the internal fault signal is at the normal level and to not generate the first pulse train signal otherwise;
a temperature fault encoder configured to generate a second pulse train signal while the transistor temperature is at the fault level and to not generate the second pulse train signal otherwise, the first pulse train signal having a lower bandwidth compared to the second pulse train signal and the second pulse train signal having a higher bandwidth compared to the first pulse train signal; and
a multiplexer configured to combine outputs of the ready encoder and the temperature fault encoder to generate a combined signal and transmit the combined signal to a high-voltage side of a transformer.

6. The power switching system according to claim 5, wherein the transceiver further includes:
a ready decoder configured to receive the combined signal from a low-voltage side of the transformer, the ready decoder including:
a filter configured to isolate the first pulse train signal from the combined signal based on the lower bandwidth of the first pulse train signal; and
a pulse detector configured to detect pulses in the first pulse train signal and to output a ready signal at a ready level while the pulses of the first pulse train signal are detected.

7. The power switching system according to claim 6, wherein the pulse detector is further configured to output the ready signal at a not-ready level after a plurality of pulses of the first pulse train signal are not detected.

8. The power switching system according to claim 5, wherein the transceiver further includes:
a temperature fault decoder configured to receive the combined signal from a low-voltage side of the transformer, the temperature fault decoder including:
a frequency detector configured to detect the higher bandwidth of the second pulse train signal and to output a fault signal at a fault level while the second pulse train signal is detected in the combined signal.

9. The power switching system according to claim 8, wherein the frequency detector is further configured to output the fault signal at a no-fault level while the second pulse train signal is not detected in the combined signal.

10. The power switching system according to claim 1, wherein:
the transistor temperature sensor is a first transistor temperature sensor configured to measure a first transistor temperature of the power transistor, the switch module further including:
a second transistor temperature sensor configured to measure a second transistor temperature of the power transistor; and
the transistor temperature sense circuit is a first temperature sense circuit configured to receive the first transistor temperature from the first transistor temperature sensor and to output a first signal based on the first transistor temperature, the gate driver further including:
a second temperature sense circuit configured to receive the second transistor temperature from the second transistor temperature sensor and to output a second signal based on the second transistor temperature; and
a logic gate configured to receive the first signal and the second signal and to output the external fault signal, the external fault signal having a level corresponding to a thermal fault when either the first signal or the second signal has a level corresponding to a thermal fault in the power transistor.

11. The power switching system according to claim 1, wherein the transceiver of the gate driver is a first transceiver, and the gate driver further includes:
a transistor temperature monitor circuit configured to compare the transistor temperature to a ramp signal to output an external monitor signal, the external monitor signal being pulse width modulated (PWM) according to the transistor temperature; and
a second transceiver configured to communicate the external monitor signal over a dedicated communication channel across the isolation barrier of the gate driver.

12. The power switching system according to claim 11, wherein the second transceiver further includes an inverter configured to invert the external monitor signal so that it is at a relatively low level more than it is at a relatively high level while the transistor temperature of the power transistor is in a normal temperature range for the power transistor to reduce a power consumed by the second transceiver.

13. The power switching system according to claim 1, wherein the gate driver is coupled to the transistor temperature sensor at a first temperature sense pin, the gate driver further including a second temperature sense pin and a disable circuit configured to disable the second temperature sense pin while it is not coupled to a second temperature sensor to reduce a power consumed by the gate driver.

14. A method for monitoring thermal conditions in a power switching system:
receiving at a sense pin of a gate driver a transistor temperature of a power transistor;

comparing the transistor temperature to a fault threshold to generate an external fault signal based on the comparison;
measuring, by a gate-driver sensor of the gate driver, a gate-driver temperature;
comparing the gate-driver temperature to a thermal-shutdown threshold to generate an internal fault signal based on the comparison;
generating a first pulse train signal based on the internal fault signal;
generating a second pulse train signal based on the external fault signal;
combining the first pulse train signal and the second pulse train signal to generate a combined signal; and
communicating the combined signal over a shared communication channel across an isolation barrier of the gate driver.

15. The method according to claim 14, further including:
decoding the combined signal to generate a ready signal based on first pulse train signal; and
decoding the combined signal to generate a sensed-temperature fault signal based on the second pulse train signal, wherein:
the ready signal corresponds to a thermal fault condition of the gate-driver temperature and the sensed-temperature fault signal corresponds to a thermal fault condition of the power transistor.

16. The method according to claim 14, further including:
comparing the transistor temperature to a ramp signal to generate an external monitor signal, the external monitor signal being a pulse width modulated (PWM) according to the transistor temperature; and
communicating the external monitor signal over a dedicated communication channel across an isolation barrier of the gate driver.

17. The method according to claim 16, wherein communicating the external monitor signal over the dedicated communication channel includes:
inverting the external monitor signal to reduce a power consumed communicating the external monitor signal across an isolation barrier of the gate driver.

18. A gate driver comprising:
a gate-driver temperature sensor configured to measure a gate-driver temperature of the gate driver;
a gate-driver temperature sense circuit configured to output a first pulse train signal corresponding to an internal fault signal based on the gate-driver temperature;
a temperature sensing and monitoring circuit including a transistor temperature sense circuit configured to receive a transistor temperature from a transistor temperature sensor coupled to the gate driver and to output a second pulse train signal corresponding to an external fault signal based on the transistor temperature; and
a transceiver configured to communicate a combined signal including the first pulse train signal and the second pulse train signal over a shared communication channel across an isolation barrier of the gate driver.

19. The gate driver according to claim 18, wherein the transceiver is configured to:
communicate the combined signal over the shared communication channel to a low-voltage side of the gate driver;
output a ready signal at a ready pin of the gate driver, the ready signal corresponding to the first pulse train signal; and
output a sensed-temperature fault signal at a temperature fault pin of the gate driver, the sensed-temperature fault signal corresponding to the second pulse train signal.

20. The gate driver according to claim 18, wherein the temperature sensing and monitoring circuit further includes a transistor temperature monitor circuit configured to generate a pulse width modulated signal corresponding to the transistor temperature, the pulse width modulated signal communicated over a dedicated communication channel to a low-voltage side of the gate driver.

21. A power switching system comprising:
a switch module including a power transistor and a transistor temperature sensor configured to measure a transistor temperature of the power transistor; and
a gate driver coupled to the switch module, the gate driver including:
a gate-driver temperature sensor configured to measure a gate-driver temperature of the gate driver;
a gate-driver temperature sense circuit configured to output an internal fault signal based on the gate-driver temperature;
a transistor temperature sense circuit configured to receive the transistor temperature from the transistor temperature sensor and to output an external fault signal based on the transistor temperature;
a transceiver configured to communicate a combined signal corresponding to the internal fault signal and the external fault signal over a shared communication channel across an isolation barrier of the gate driver;
a first temperature sense pin coupled to the transistor temperature sensor;
a second temperature sense pin; and
a disable circuit configured to disable the second temperature sense pin while it is not coupled to a second temperature sensor to reduce a power consumed by the gate driver.

* * * * *